United States Patent
Nakagawa et al.

(10) Patent No.: US 7,796,664 B2
(45) Date of Patent: Sep. 14, 2010

(54) SEMICONDUCTOR LASER

(75) Inventors: Yasuyuki Nakagawa, Tokyo (JP); Harumi Nishiguchi, Tokyo (JP); Kyosuke Kuramoto, Tokyo (JP); Masatsugu Kusunoki, Tokyo (JP); Takeo Shirahama, Tokyo (JP); Yosuke Suzuki, Tokyo (JP); Hiromasu Matsuoka, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 16 days.

(21) Appl. No.: 12/348,061

(22) Filed: Jan. 2, 2009

(65) Prior Publication Data
US 2009/0185595 A1 Jul. 23, 2009

(30) Foreign Application Priority Data
Jan. 18, 2008 (JP) .............................. 2008-009755

(51) Int. Cl.
*H01S 5/00* (2006.01)
(52) U.S. Cl. ................................ 372/49.01; 372/43.01
(58) Field of Classification Search ............... 372/49.01, 372/43.01
See application file for complete search history.

(56) References Cited

U.S. PATENT DOCUMENTS

| | | | |
|---|---|---|---|
| 5,960,021 A | 9/1999 | De Vrieze et al. | |
| 6,635,559 B2 * | 10/2003 | Greenwald et al. | 438/604 |
| 7,106,775 B2 | 9/2006 | Matsuoka et al. | |
| 2003/0048823 A1 | 3/2003 | Yamanaka | |
| 2004/0042520 A1 | 3/2004 | Shigihara et al. | |
| 2006/0133442 A1 * | 6/2006 | Kondou et al. | 372/49.01 |
| 2007/0080368 A1 | 4/2007 | Kamikawa et al. | |
| 2007/0177646 A1 | 8/2007 | Sogabe et al. | |

FOREIGN PATENT DOCUMENTS

| | | |
|---|---|---|
| CN | 1543026 A | 10/2004 |
| CN | 101013794 A | 8/2007 |
| JP | 2000-022269 | 1/2000 |
| JP | 2002-335053 | 11/2002 |
| JP | 2003-078199 | 3/2003 |

* cited by examiner

*Primary Examiner*—Minsun Harvey
*Assistant Examiner*—Kinam Park
(74) *Attorney, Agent, or Firm*—Leydig, Voit & Mayer, Ltd.

(57) ABSTRACT

A GaN laser, includes a coating film on a front end surface through which laser light is emitted. The coating film includes a first insulating film in contact with the front end surface and a second insulating film on the first insulating film. The optical film thickness of the second insulating film is an odd multiple of $\lambda/4$ with respect to the wavelength $\lambda$ of laser light produced by the semiconductor laser. The adhesion of the first insulating film to GaN is stronger than the adhesion of the second insulating film to GaN. The refractive index of the second insulating film is 2 to 2.3 thick. The first insulating film is 10 nm or less. The first insulating film is an oxide film having a stoichiometric composition.

3 Claims, 2 Drawing Sheets

SEMICONDUCTOR LASER

BACKGROUND OF THE INVENTION

1. Field of the Invention

The present invention relates to a GaN semiconductor laser having a coating film formed on a front end surface through which laser light is emitted and, more particularly, to a semiconductor laser in which the reflectance of a coating film is set in the range from 3 to 13%, and which is capable of preventing separation of the coating film and being reliable.

2. Background Art

Semiconductor lasers are being widely used in optical disk systems, optical communication, etc. In recent years, GaN semiconductor lasers which emit blue laser light have been put to use. A semiconductor laser has a front end surface through which laser light is emitted and a rear end surface opposed to the front end surface. Coating films are formed on the front end surface and the rear end surface to achieve, for example, a reduction in the operating current for the semiconductor laser, prevention of return light and an increase in output.

A semiconductor laser required to have an increased output ordinarily has a coating film of a low reflectance formed on the front end surface and a coating film of a high reflectance formed on the rear end surface. The reflectance of the coating film on the rear end surface is ordinarily 60% or more, preferably 80% or more. On the other hand, it is not sufficient to simply lower the reflectance of the coating film on the front end surface. The reflectance at the front end surface is set according to a characteristic required of the semiconductor laser. For example, a reflectance of about 0.01 to 3% is set in a fiber amplifier excitation semiconductor laser used with a fiber grating; a reflectance of about 3 to 7% in an ordinary high-output semiconductor laser; and a reflectance of about 7 to 13% in a case where there is a need to take a measure against return light.

FIG. 3 is a diagram showing a film thickness dependence of the reflectance of a coating film using a single layer of $Al_2O_3$ film. For example, in a case where the film thickness of $Al_2O_3$ film is set to 91.5 nm in order to set the reflectance to about 10%, the actual reflectance is 9.91%; the reflectance can be set within the target range from 3 to 13%. In this case, if the film thickness of $Al_2O_3$ film varies by ±5%, the reflectance varies largely between the minimum 7.72 and the maximum 12.03%. To limit this reflectance variation, the film thickness may be set in the vicinity of an inflection point of the reflectance. In the case of $Al_2O_3$ film, however, the reflectance at the inflection point is 1% or less, out of the range from 3 to 13%.

FIG. 4 is a diagram showing a film thickness dependence of the reflectance of a coating film using a single layer of $Ta_2O_5$ film. In the case of $Ta_2O_5$ film, the reflectance at an inflection point is about 10%. Therefore, if a single layer of $Ta_2O_5$ film is used as coating film on the front end surface, the reflectance can be set within the range from 3 to 13% while limiting variation in the reflectance.

A technique using a two-layer film formed of $AlO_x$ film (0<x<1.5) and $Al_2O_3$ as coating film has also been proposed (see, for example, Japanese Patent Laid-Open No. 2002-335053).

SUMMARY OF THE INVENTION

Because $Ta_2O_5$ film has low adhesion to a GaN substrate, there is a problem that if a single layer of $Ta_2O_5$ film is used as coating film, separation of the coating film occurs.

Also, the amount of oxygen in $AlO_x$ film (0<x<1.5) is smaller than that in the stoichiometric composition and, therefore, the absorption of light by the $AlO_x$ film is large. If such a film is used as coating film, the crystal in the vicinity of the interface between the semiconductor laser and the coating film deteriorates. The reliability of the semiconductor laser is impaired thereby.

In view of the above-described problem, an object of the present invention is to provide a semiconductor laser in which the reflectance of a coating film is set in the range from 3 to 13%, and which is capable of preventing separation of the coating film and being reliable.

According to one aspect of the present invention, a semiconductor laser formed as a GaN laser, comprises a coating film formed on a front end surface through which laser light is emitted, the coating film having a first insulating film in contact with the front end surface and a second insulating film formed on the first insulating film. The optical film thickness of the second insulating film is an odd multiple of $\lambda/4$ with respect to the wavelength $\lambda$ of laser light produced by the semiconductor laser; the adhesion of the first insulating film to GaN is stronger than the adhesion of the second insulating film; the refractive index of the second insulating film is 2 to 2.3; the film thickness of the first insulating film is 10 nm or less; and the first insulating film is an oxide film of a stoichiometric composition.

According to the present invention, the reflectance of a coating film is set in the range from 3 to 13%, separation of the coating film can be prevented and the reliability of the semiconductor laser can be ensured.

Other and further objects, features and advantages of the invention will appear more fully from the following description.

DETAILED DESCRIPTION OF THE PREFERRED EMBODIMENTS

Figure 1:
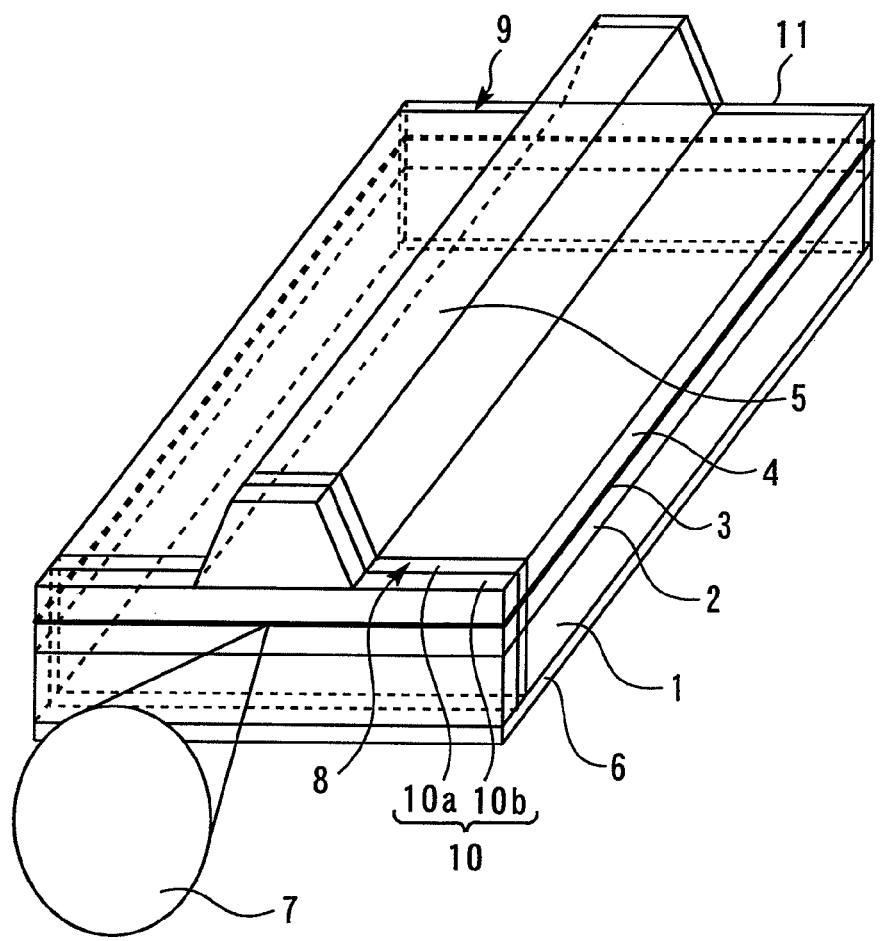
FIG. 1 is a perspective view showing a semiconductor laser according to an embodiment of the present invention.
Figure 2:
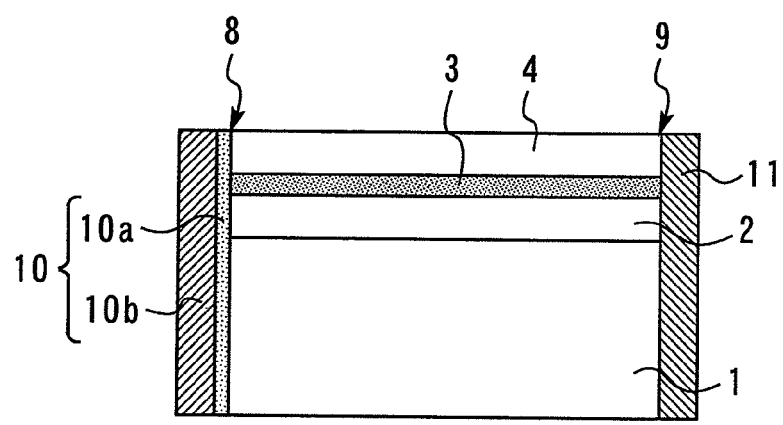
FIG. 2 is a sectional view of the semiconductor laser.
Figure 3:
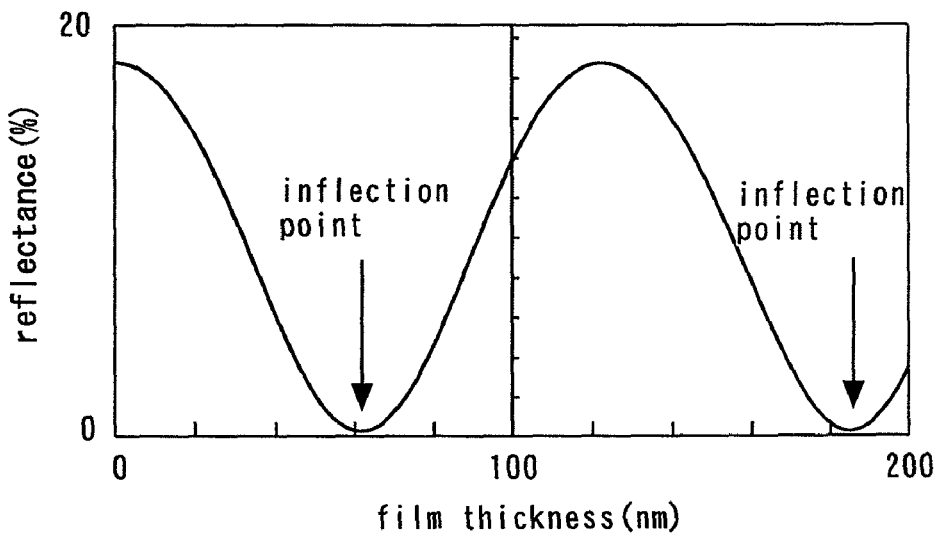
FIG. 3 is a diagram showing a film thickness dependence of the reflectance of a coating film using a single layer of $Al_2O_3$ film.
Figure 4:
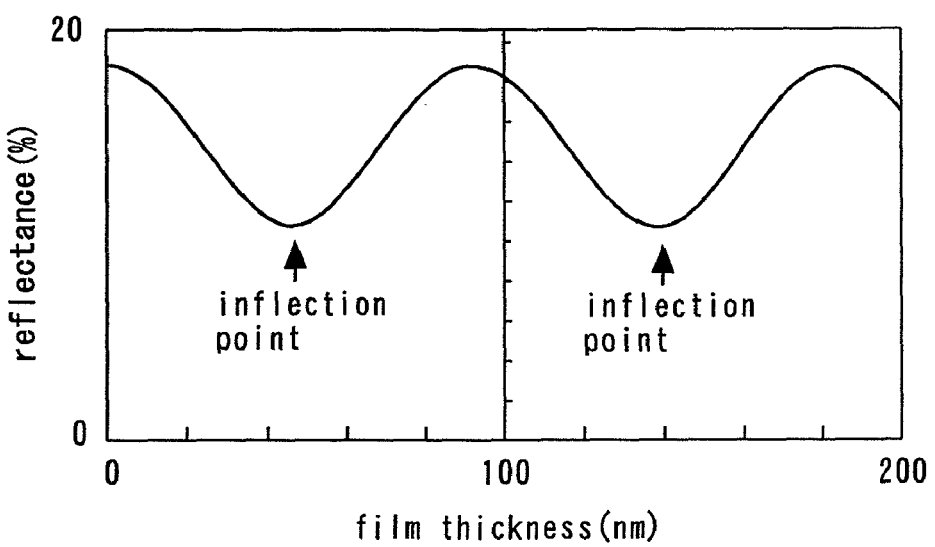
FIG. 4 is a diagram showing a film thickness dependence of the reflectance of a coating film using a single layer of $Ta_2O_5$ film.

FIG. 1 is a perspective view showing a semiconductor laser according to an embodiment of the present invention. FIG. 2 is a sectional view of the semiconductor laser. The semiconductor laser according to the embodiment is a GaN semiconductor laser which emits blue laser light.

An n-clad layer 2, an active layer 3 and a p-clad layer 4 are formed in this order on a GaN substrate 1. A ridge-type p-electrode 5 is formed thereon. An n-electrode 6 is formed on the back surface of the GaN substrate 1. The GaN substrate 1, the n-clad layer 2, the active layer 3, the p-clad layer 4, the p-electrode 5 and the n-electrode 6 constitute a resonator along a direction in which laser light travels. One end of the resonator is a front end surface 8 through which laser light is emitted, and the other end of the resonator is a rear end surface 9.

When the above-described semiconductor laser is operated, a positive electric field is applied to the p-electrode 5 and a negative electric field is applied to the n-electrode 6. Positive holes and electrons are thereby injected into the active layer 3 from the p-clad layer 4 and the n-clad layer 2, respectively. These positive holes and electrons couple with each other to produce laser light 7 in the active layer 3. The laser light 7 travels in the active layer 3 along the resonator to be emitted from the front end surface 8 side.

A coating film 10 is formed on the front end surface 8, while a coating film 11 is formed on the rear end surface 9. The coating film 10 has $Al_2O_3$ film 10a (first insulating film) in contact with the front end surface 8, and $Ta_2O_5$ film 10b (second insulating film) formed on the $Al_2O_3$ film 10a. The $Al_2O_3$ film 10a and the $Ta_2O_5$ film 10b are formed, for example, by sputtering using electron cyclotron resonance or by chemical vapor deposition.

The coating film 11 is a multilayer film formed of $SiO_2$ film and $Ta_2O_5$ film for example. The coating film 11 has a high reflectance of about 90%, higher than that of the coating film 10. With this arrangement, the loss of laser light through the rear end surface 9 can be limited. As a result, a high optical output of 50 mW or more can be obtained from the front end surface 8.

The optical film thickness of the $Ta_2O_5$ film 10b is an odd multiple of $\lambda/4$ with respect to the wavelength $\lambda$ of laser light produced by the semiconductor laser. The field intensity at the interface between the semiconductor laser and the coating film 10 is thereby reduced. Therefore, deterioration of the crystal in the vicinity of the interface can be prevented to ensure the reliability of the semiconductor laser.

The adhesion of the $Al_2O_3$ film 10a to the GaN is stronger than that of the $Ta_2O_5$ film 10b. Therefore, separation of the coating film 10 can be prevented.

The refractive index of the $Ta_2O_5$ film 10b is 2 to 2.3. Therefore, the reflectance of the coating film 10 can be set within the target range from 3 to 13% with respect to the GaN semiconductor laser. The film thickness of the $Al_2O_3$ film 10a is 10 nm or less. Therefore, the reflectance of the front end surface 8 of the semiconductor laser can be set without being influenced by the refractive index of the $Al_2O_3$ film 10a.

The $Al_2O_3$ film 10a is an oxide film of a stoichometric composition, so that the amount of absorption of light by the $Al_2O_3$ film 10a is small. Therefore, deterioration of the crystal in the vicinity of the interface between the semiconductor laser and the coating film 10 can be prevented to ensure the reliability of the semiconductor laser.

$SiO_2$ film may be used in place of the $Al_2O_3$ film 10a. Also, a film formed of one of $Nb_2O_5$, $HfO_2$, $ZrO_2$, $Y_2O_3$, AlN and SiN may be used in place of the $Ta_2O_5$ film 10b.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-009755, filed on Jan. 18, 2008 including specification, claims, drawings and summary, on which the Convention priority of the present application is based, are incorporated herein by reference in its entirety.

What is claimed is:

1. A GaN laser, comprising:
   a coating film on a front end surface through which laser light is emitted, the coating film including a first insulating film in contact with the front end surface and a second insulating film on the first insulating film, wherein
   optical film thickness of the second insulating film is an odd multiple of $\lambda/4$ with respect to the wavelength $\lambda$ of laser light produced by the GaN laser,
   adhesion of the first insulating film to GaN is stronger than adhesion of the second insulating film to GaN,
   refractive index of the second insulating film is 2 to 2.3,
   the first insulating film is no more than 10 nm thick, and
   the first insulating film is $Al_2O_3$ or $SiO_2$ having a stoichiometric composition.

2. The semiconductor laser according to claim 1, wherein the second insulating film is selected from the group consisting of $Ta_2O_5$, $Nb_2O_5$, $HfO_2$, $ZrO_2$, $Y_2O_3$, AlN, and SiN.

3. The semiconductor laser according to claim 1 wherein the coating film has a reflectivity at the wavelength $\lambda$ in a range from 3% to 13%.

* * * * *